United States Patent
Ratnakumar

[11] Patent Number: 5,959,889
[45] Date of Patent: Sep. 28, 1999

[54] COUNTER-BIAS SCHEME TO REDUCE CHARGE GAIN IN AN ELECTRICALLY ERASABLE CELL

[75] Inventor: K. Nirmal Ratnakumar, San Jose, Calif.

[73] Assignee: Cypress Semiconductor Corp., San Jose, Calif.

[21] Appl. No.: 08/998,258

[22] Filed: Dec. 29, 1997

[51] Int. Cl.⁶ .................................................. G11C 16/04
[52] U.S. Cl. ............................ 365/185.18; 365/185.01; 365/185.05
[58] Field of Search ...................... 365/185.18, 185.01, 365/185.05

[56] References Cited

U.S. PATENT DOCUMENTS

| | | | |
|---|---|---|---|
| 5,101,378 | 3/1992 | Radji et al. ................. | 365/185.18 X |
| 5,331,590 | 7/1994 | Josephson et al. ............ | 365/182 |
| 5,359,573 | 10/1994 | Wang ........................ | 365/185 |
| 5,742,542 | 4/1998 | Lin et al. .................. | 365/185.08 |
| 5,748,525 | 5/1998 | Wong et al. ................. | 365/185.05 |

*Primary Examiner*—Huan Hoang
*Attorney, Agent, or Firm*—Blakely Sokoloff Taylor & Zafman LLP

[57] ABSTRACT

A counter-bias scheme to reduce or eliminate charge gain in a single-poly or double-poly electrically erasable ($E^2$) cell having separate program and read transistors which may be configured as a 6-wire cell includes applying a counter-bias voltage to the drain of a program select transistor of the $E^2$ cell during a read operation. The counter-bias voltage may be approximately equal to a voltage on the floating gate of the cell during the read operation. The present scheme reduces the threshold voltage shifts which may otherwise be experienced in the cell during continuous read operations. In particular, the counter-bias voltage acts to reduce the electric field across the tunnel oxide of the program select transistor, thus reducing the charge gain on the floating gate.

8 Claims, 5 Drawing Sheets

Layers:

☐ Poly - silicon

┌ ┐
└ ┘ Diffusion

□ Buried N⁺ Implant

⊠ Metal Contract

▨ Tunnel Oxide 5,959,889

COUNTER-BIAS SCHEME TO REDUCE CHARGE GAIN IN AN ELECTRICALLY ERASABLE CELL

FIELD OF THE INVENTION

This invention relates generally to electrically erasable cells and, more particularly, to a scheme for controlling read operations of such a cell.

BACKGROUND

Electrically erasable ($E^2$) cells are commonly used in programmable devices such as electrically erasable programmable read only memories (EEPROMs), programmable logic devices (PLDs) and the like. One such $E^2$ cell may be modeled as separate high voltage and low voltage select transistors for respective program and read operations. Such a cell has become known as a "6-wire cell" because it includes six nodes for connection (i.e., six voltage terminals). A so-called "5-wire cell" is similar in design but has its program and read gates tied together. A detailed description of a conventional 6-wire cell may be found in U.S. Pat. No. 5,331,590, the entire disclosure of which is incorporated herein by reference.

A conventional 6-wire cell 10 is illustrated in FIG. 1A. In the figure, cell 10 is shown partially schematically and partially with reference to semiconductor region representations. Such an illustration is the means commonly used by those skilled in the relevant arts to communicate their ideas to one another and further facilitates a discussion of certain biasing characteristics which will be of interest with respect to the present invention. Cell 10 includes an electrically erasable and programmable transistor 12 which includes a floating gate, indicated by FG. A drain of transistor 12 is connected to terminal D of cell 10. Transistor 12 may be programmed to be either conductive (programmed) or non-conductive (erased) by applying appropriate voltages to its terminals and through the use of a program path of cell 10 which includes program select transistor 14.

The conduction of transistor 14 is controlled by a voltage $V_{pg}$ applied (or not) to the gate of transistor 14. As will be understood with reference to the detailed description below, the floating gate of transistor 12 includes a portion which is adjacent to a buried implant region. The buried implant region is separated from the floating gate by a tunnel oxide which permits the programming and/or erasing of transistor 12 using Fowler-Nordheim tunneling as is well known in the art. The capacitance which exists by virtue of this layout is illustrated as capacitor C1 in FIG. 1A.

The control gate function for transistor 12 is provided by the same buried implant over a second thin oxide region connected to a control gate terminal CG. The floating gate is separated from the control terminal CG by an oxide layer, thicker than the tunnel oxide, having a capacitance Cc. Capacitance Cc acts to couple voltages onto the floating gate from terminal CG.

Read operations for cell 10 are controlled using read select transistor 16, which is connected in a read path of cell 10 between transistor 12 and terminal S. A read control voltage $V_{rg}$ is applied to the gate of transistor 16 to facilitate read operations and the state of transistor 12 (conducting/programmed or non-conducting/erased) may be determined by measuring the current $I_{read}$ through the read path when $V_{rg} \approx 3$–6 V and $V_c = 1$–2 V.

For proper data retention, an erased cell should not lose electrons (charge loss) from the floating gate. Conversely, for a programmed cell the FG should not gain electrons (charge gain). Any charge loss or charge gain which might inevitably occur should not lead to a change in the threshold voltage of the cell (Vt shift) of significantly more than 300 mV.

FIG. 1A further illustrates conventional biasing voltages used during read operations for cell 10. As shown, during conventional read operations, no voltage is applied to the drain of the program select transistor 14 (i.e., VPG=0). further, $V_s=0$ and $V_{rg}$ is raised to approximately Vcc (e.g., 3–6 V). The drain of transistor 12 is at approximately 1.5 V and the read current, $I_{read}$, is controlled by $V_{fg}$. Under these conditions, $V_{fg}$ is approximately 2.5–6 V (compared to Vfg≈–1 to –4.5 V when the cell is erased) and the tunnel oxide is susceptible to conduction of tunneling currents from the buried implant region because the floating gate is biased positive. For a tunnel oxide of 80 Å thickness, the oxide field is approximately 4–5 MV/cm, leading to a significant Fowler-Nordheim tunneling current. $V_{fg}$ is most positive for a programmed cell when $V_{cg}$ is positive, i.e., during a read operation. Thus, such conditions may lead to unacceptable charge gain, causing a $V_t$ shift of more than 0.3 V for a few cells 10 during continuous read operations (e.g., such as in dynamic burn-in, which typically lasts 500–2000 hrs at 135–165° C. and $V_{cg}=V_{cg\ read}$).

FIG. 1B illustrates this shift in $V_t$ for some cells which may occur after continuous reads (e.g., as may be experienced during burn-in of a device which includes a number of cells 10). As shown, during some initial read operations, the distribution of threshold voltages $V_t$ for all of the cells 10 of a device (e.g., an EEPROM, PLD or the like) may be uniformly distributed about a nominal value. However, after a number of continuous read operations (e.g., during a burn-in), the distribution may become skewed, corresponding to a number of cells exhibiting a large $V_t$ shift ($\Delta V_t$). FIG. 1C illustrates the corresponding shift in read current ($\Delta I_{read}$) which may be experienced by a number of cells as a result of the shift in threshold voltages.

It would be desirable to avoid such threshold voltage shifts for $E^2$ cells such as cell 10 because such shifts tend to have a negative impact on device speed and may also lead to functional failures of the cells.

SUMMARY OF THE INVENTION

A counter-bias scheme to reduce or eliminate charge gain in an electrically erasable cell is described. In one embodiment, the cell may be a single-poly or double-poly $E^2$ cell having separate program and read transistors and may be configured as a 6-wire cell. The scheme includes applying a counter-bias voltage to the drain of the program select transistor of the $E^2$ cell during a read operation. The counter-bias voltage may be approximately equal to a voltage on the floating gate of the cell during the read operation.

The present scheme reduces the threshold voltage shifts which may otherwise be experienced in the cell during continuous read operations. In particular, the counter-bias voltage acts to reduce the electric field across the tunnel oxide of the program select transistor, thus reducing the charge gain on the floating gate.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A counter-bias scheme to reduce or eliminate charge gain in an electrically erasable ($E^2$) cell is described. In one embodiment, the cell may be a single-poly or double-poly $E^2$ cell having separate program and read select transistors and may be configured as a 6-wire cell. The scheme includes applying a counter-bias voltage to the drain of the program select transistor of the $E^2$ cell during a read operation. The counter-bias voltage may be approximately equal to a voltage on the floating gate of the cell during the read operation.

The present scheme reduces the threshold voltage shifts which may otherwise be experienced in the cell during continuous read operations. In particular, the counter-bias voltage acts to reduce the electric field across the tunnel oxide of the program select transistor, thus reducing the charge gain on the floating gate.

The present scheme is applicable to both double-poly and single-poly $E^2$ cells. For purposes of explanation, implementation for a single-poly, 6-wire $E^2$ cell will be discussed. However, it should be readily apparent that the present invention may be readily adapted for use in a double-poly, 6-wire $E^2$ cell.

Figure 2:
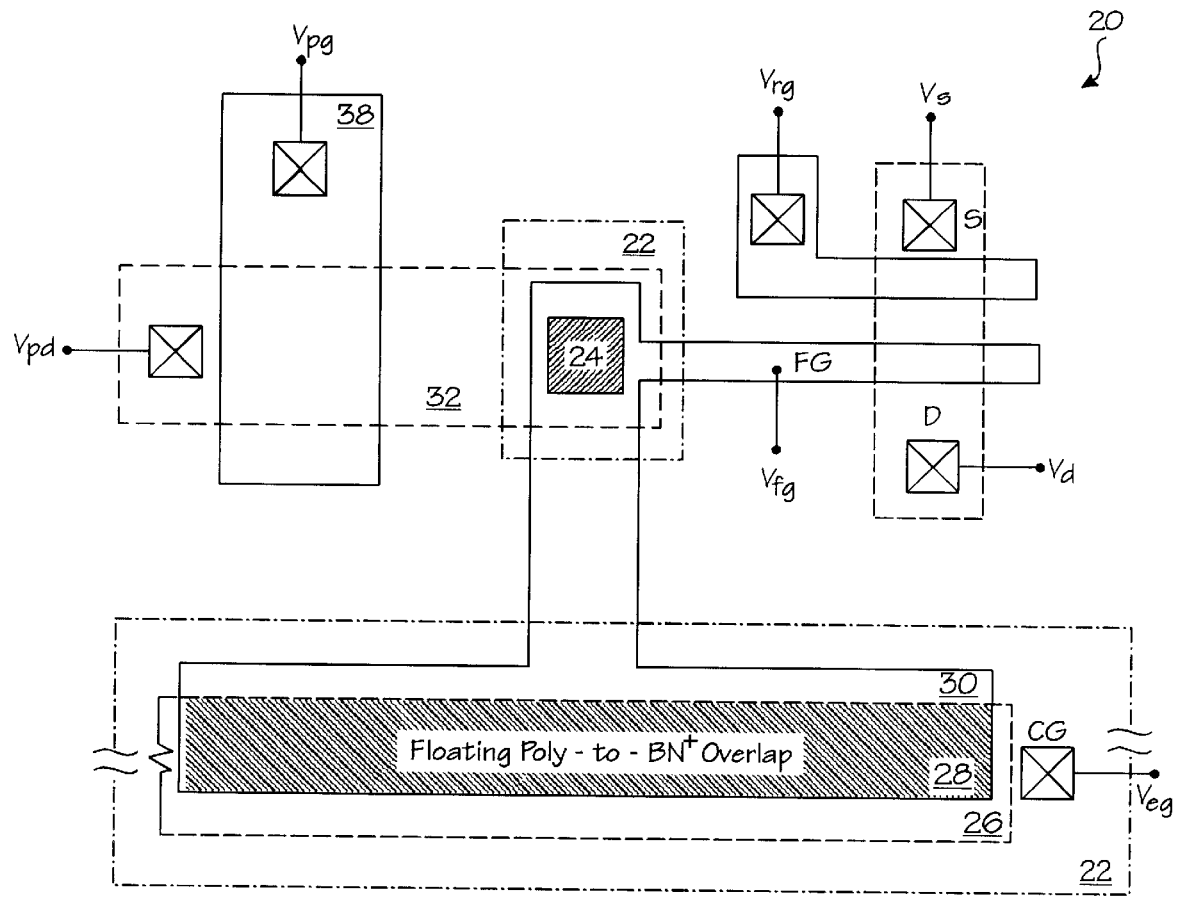
FIG. 2 shows the layout for a single-poly, 6-wire cell which may be biased in accordance with one embodiment of the present invention.
Figure 3:
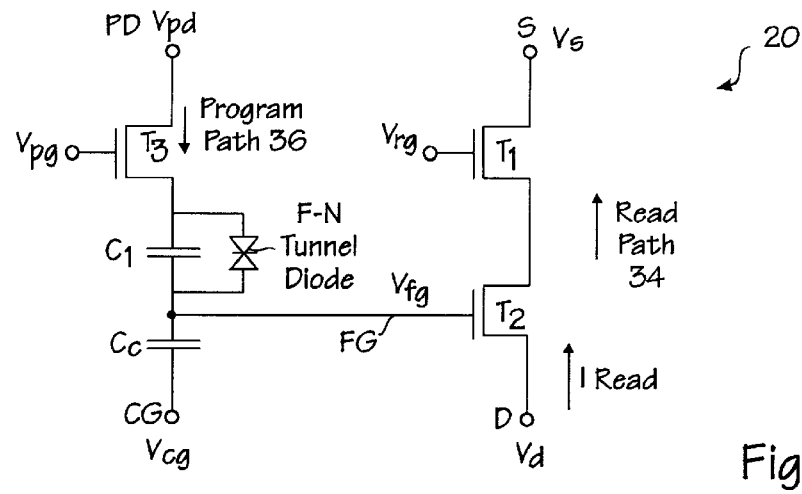
FIG. 3 shows the equivalent circuit for the 6-wire cell shown in FIGS. 2.

The layout for a single-poly, 6-wire cell 20 and its equivalent circuit are shown in FIGS. 2 and 3, respectively. In the following description and in the figures, the substrate is assumed to be p-type. Of course, it should be appreciated that the cell could be formed using p+ buried implants and PMOSFETs for an n-type substrate.

The cell 20 structure can be understood as follows. A large $N^+$ dose is implanted after formation of field oxide isolation structures but before the deposition of poly-silicon layers. This implant is referred to as a buried-$N^+$ implant ($BN^+$) 22. $BN^+$ regions 22 surround a thin tunnel oxide region 24 as well as a $BN^+$ diffusion region 26, referred to as a coupling gate (CG). The overlap area 28 of $BN^+$ 22 underneath a floating poly-silicon layer 30 is large and accounts for the large coupling capacitance Cc in FIG. 3. The oxide for Cc is much thicker than the tunnel oxide to avoid Fowler-Nordheim tunneling through this "Cc oxide" during any mode of cell operation (program, erase and/or read). The floating poly-silicon layer 30 (FP) surrounds the tunnel oxide region 24 and the capacitance between the FP 30 and the diffusion region 32 surrounding the tunnel oxide 24 is indicated as C1 in FIG. 3. C1 includes the tunnel oxide capacitance. An applied voltage Vcg is coupled to the floating gate (FG) by the capacitor divider coupling ratio:

$$K_g = \frac{\Delta V_{fg}}{\Delta V_{cg}} = \frac{C_c}{C_c + C_1} \approx 0.8$$

where $K_g$ is the coupling ratio.

Figure 1A:
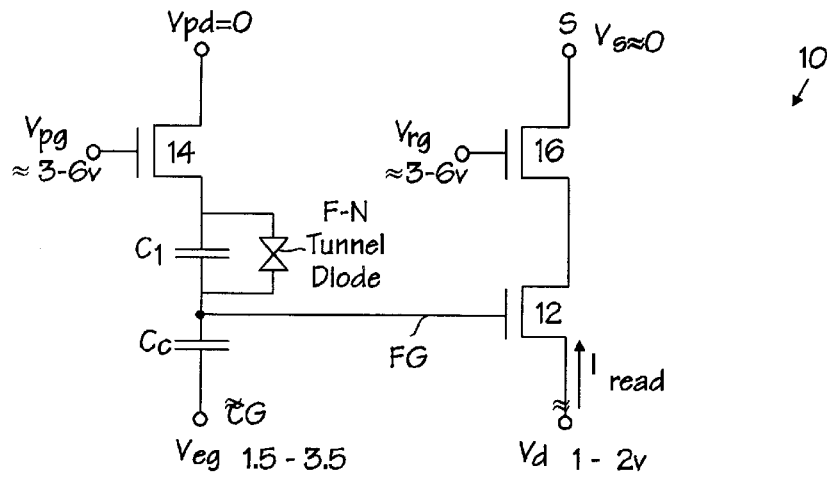
FIG. 1A illustrates a conventional 6-wire cell under conventional read bias conditions.

FIG. 3 illustrates cell 20 partially schematically and partially with reference to the above semiconductor regions. Cell 20 includes a read path 34 which has two transistors T1 and T2 in series. T2 is controlled by a voltage $V_{fg}$ applied to the floating gate and T1 is a "read select" transistor which is turned "on" or "off" by a voltage $V_{rg}$ applied to the read gate. Transistor T2 is an electrically erasable and programmable transistor and is similar to transistor 12 in FIG. 1A. Transistor T2 may be programmed to be either conductive (programmed) or non-conductive (erased) by applying appropriate voltages to its terminals and through the use of a program path 36 of cell 20 which includes program select transistor T3.

The conduction of transistor T3 is controlled by a voltage $V_{pg}$ applied (or not) to its gate. As shown in the layout illustration of FIG. 2, the floating gate 38 of transistor T3 includes a portion which is adjacent to the $BN^+$ region 22. The $BN^+$ region 22 is separated from the floating gate 38 by the tunnel oxide 24 which permits the programming and/or erasing of transistor T2 using Fowler-Nordheim tunneling.

Cell 20 has three modes of operation (refer to Table 1 for typical voltages), which may be described as follows:

Mode 1 (Erase): A high voltage ($V_{cg}$) is applied to the control gate (CG). This couples to FG as a large $V_{fg}$ and electrons tunnel from the $BN^+$ region 22 through the tunnel oxide 24 to the FG. This raises the threshold voltage ($V_t$) of the cell and during a read operation, the cell is "off" (i.e., no cell current flows).

Mode 2 (Program): High voltages $V_{pg}$ and $V_{pd}$ are applied to the program select transistor T3. A high voltage is passed on to $BN^+$22 surrounding the tunnel oxide 24. This removes electrons from the FG by Fowler-Nordheim tunneling and lowers the cell's $V_t$. In a read operation after programming, cell 20 conducts and is said to be "on".

Mode 3 (Read): In this mode, $V_s=0$ and $V_{rg}$ is raised to approximately Vcc. The drain of transistor T2 (terminal D) is at approximately 1.5V and the read current ($I_{read}$) is controlled by $V_{fg}$.

Conventional bias voltages typical for a 6-wire cell 20 are given in Table 1. As discussed above, during conventional read operations, $V_{pd}=0$.

TABLE 1

| Operation | Time (msec) | $V_{cg}$ (V) | $V_{pg}$ (V) | $V_{pd}$ (V) | $V_{rg}$ (V) | $V_s$ (V) | $V_d$ (V) | $V_t$ (V) | $I_{read}$ (μA) |
|---|---|---|---|---|---|---|---|---|---|
| Erase | 1–100 | 10–14 | 3–5 | 0 | 0 | X | X | >3 | NA |
| Program | 1–100 | 0 | 11–15 | 10–13 | 0 | X | X | <0 | NA |
| Read erased cell | NA | ≈2.5 | 3–5 | 0 | 3–5 | ≈0 | 1–2 | NA | ≈0 |
| Read programmed cell | NA | ≈2.5 | 3–5 | 0 | 3–5 | ≈0 | 1–2 | NA | >100 |

Key:
X = don't care
NA = not applicable

Such bias conditions during read operations tend to cause $V_t$ shifts in some 6-wire cells as described above. The $V_t$ shifts may be due to charge gain experienced as a result of the floating gate of a programmed cell gaining electrons.

There may be several factors that would lead to a $V_t$ shift of more than 0.3 V for a few 6-wire cells during continuous reads, e.g., over ten years. Some of these are: (1) variations in intrinsic oxide qualities of the various cells of a programmable device, (2) extrinsic defect distribution among the cells, and (3) trapping of charges in the oxide and trap assisted tunneling within the cells. As indicated above, significant $V_t$ shifts (e.g., $V_t$ shifts greater than 1 V) lead to undesirable results (e.g., a programmed or "on" cell may be read as an "off" cell because $I_{read}$ is too small).

Figure 4A:
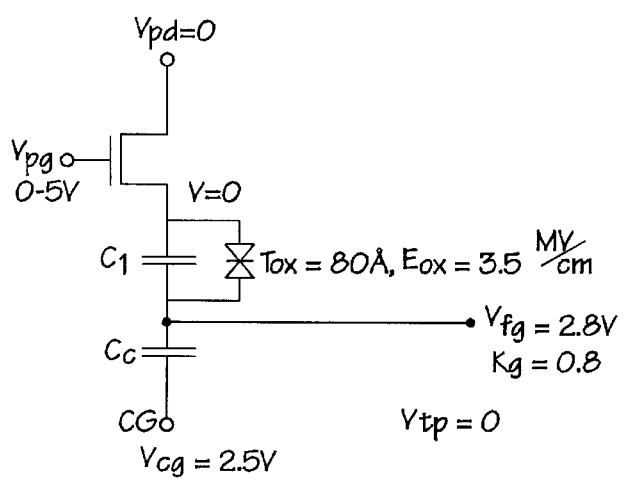
FIG. 4A shows cell node voltages during a read in a conventional scheme with $V_{pd}=0$.
Figure 4B:
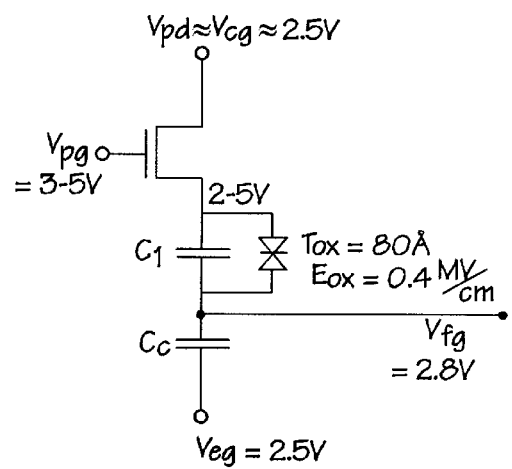
FIG. 4B shows cell node voltages during a read according to the present invention with $V_{pd} \approx V_{cg}$.

The present counter-bias scheme for read operations tends to eliminate or at least drastically reduce the $V_t$ shifts which may be experienced by 6-wire cells such as cell 20 as a result of continuous read operations. The present scheme recognizes that one criterion to keep the $V_t$ shift less than 0.3 V for all of the cells of a programmable device is to maintain Eox, the electric field across the tunnel oxide, below 2.5 MV/cm. To accomplish this goal, new read bias voltages are introduced for the cell 20 during read operations. For comparison purposes, the read bias conditions for a conventional scheme and a scheme in accordance with the present invention are depicted in FIGS. 4A and 4B, respectively.

Table 2 also reports the conventional and new read bias conditions for the cell. In arriving at the reported voltages, it is assumed that the tunnel oxide thickness is approximately 80 Å and $V_t$=0 (i.e., the cell is programmed). In addition, the cell 20 is fabricated to provide the following coupling ratios:

From CG to FG, $K_g$=0.8
From PD to FG, $K_{pd}$=0.13
From (read) Drain (D) to FG, $K_{rd}$=0.06

TABLE 2

| Cell Bias Scheme | $V_{pg}$ (V) | $V_{pd}$ (V) | $V_{ps}$ (V) | $V_{cg}$ (V) | $V_d$ (V) | $V_{fg}$ (V) | $E_{ox}$ (MV/cm) |
|---|---|---|---|---|---|---|---|
| Conventional | NA | 0 | 0 | 2.5 | 1.2 | 2.57 | 3.6 |
| New | >3 | 2.5 | 2 | 2.5 | 1.2 | 3.13 | 1.4 |

Thus, according to one embodiment of the present invention, a counter-bias voltage ($V_{pd}$≈Vcg≈2.5 V for the above example in Table 2) is applied to the drain of the program select transistor T3 during read operations. This counter-bias voltage approximately equals the voltage on the floating gate (FG) of the programmable transistor T2. Under these conditions, the tunnel oxide electric field ($E_{ox}$) strength is brought down from approximately 4.5 MV/cm to less than 1.4 MV/cm. This now eliminates the charge gain on the floating gate, which is otherwise usually worst under read conditions.

Figure 5A:
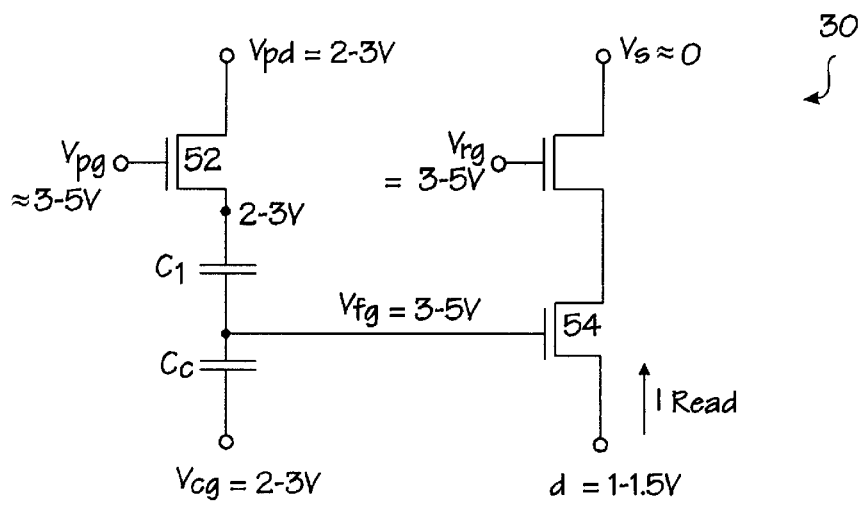
FIG. 5A shows cell read bias conditions according to one embodiment of the present invention.
Figure 5B:
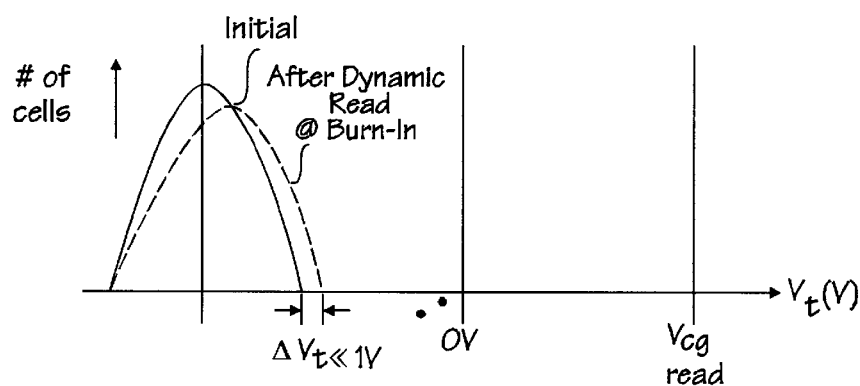
FIG. 5B shows the reduced threshold voltage shifts which may be experienced for 6-wire cells under read bias conditions of one embodiment of the present invention.
Figure 5C:
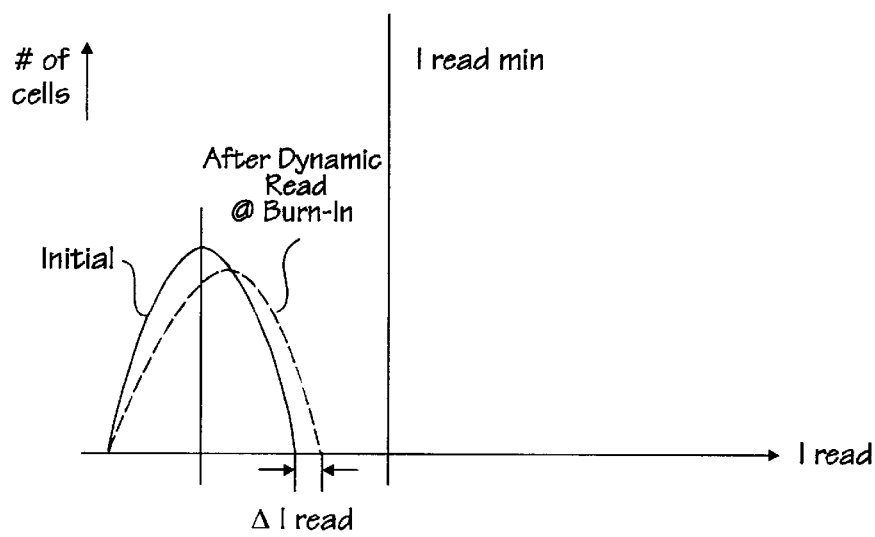
FIG. 5C shows the reduced read current shifts which may be experienced for 6-wire cells under read bias conditions of one embodiment of the present invention.

FIGS. 5A, 5B and 5C illustrate the effect of the new counter-bias voltage. In particular, FIG. 5A illustrates the new biasing voltages used during read operations for cell 50. As shown, a counter-bias voltage ($V_{pd}$≈-2–3 V) is applied to the drain of the program select transistor 52. As before, $V_s$=0 and $V_{rg}$ is raised to approximately Vcc (e.g., 3–5 V). The drain of transistor 54 is at approximately 1.5 V and the read current, $I_{read}$, is controlled by $V_{fg}$. Under these conditions, $V_{fg}$ is again approximately 3–5 V.

In this situation, $E_{ox}$ under is ≈1 MV/cm for the present counter-bias scheme. Thus, the tunnel oxide field strength for read operations ($E_{ox}$) has been reduced by more than three times from that which was experienced under conventional read bias conditions. This low $E_{ox}$ makes charge gain negligible.

Figure 1B:
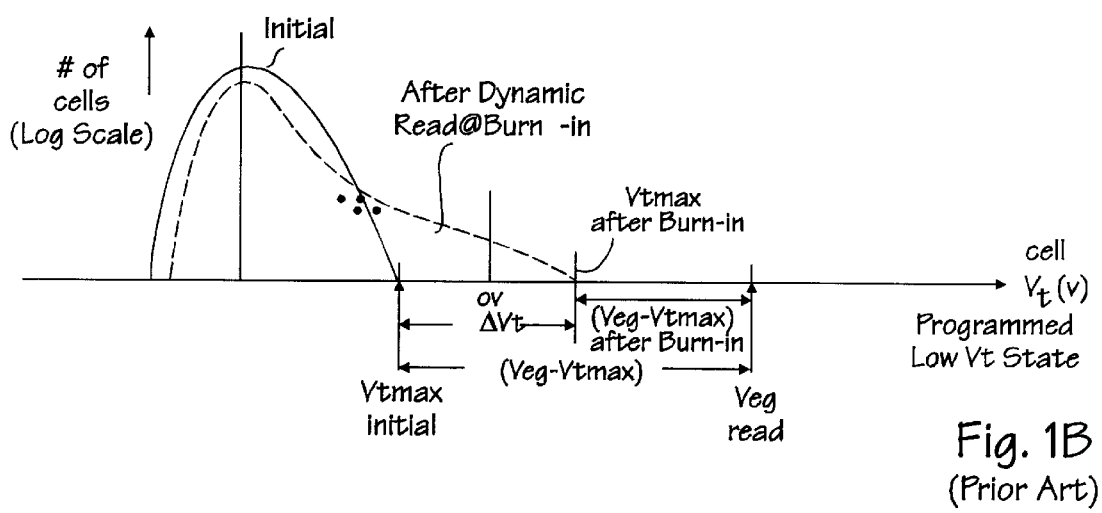
FIG. 1B illustrates a threshold voltage shift which may be experienced for 6-wire cells under the conventional read bias conditions shown in FIG. 1A.
Figure 1C:
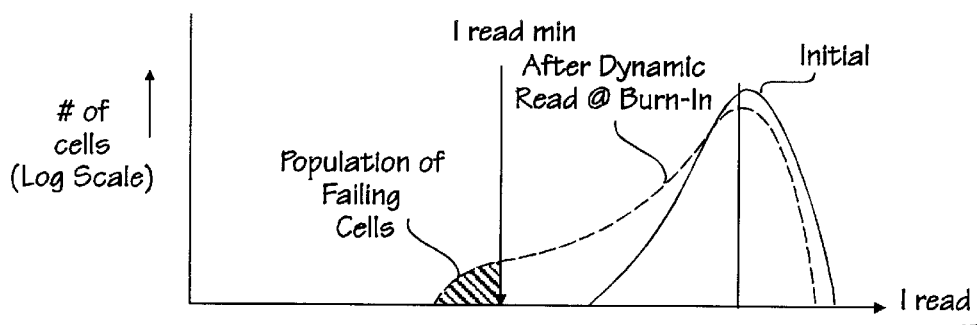
FIG. 1C illustrates a read current shift which may be experienced for 6-wire cells under the conventional read bias conditions shown in FIG. 1A.

FIG. 5B illustrates the reduced shift in $V_t$ for the cells 50 which may occur after continuous reads (e.g., as may be experienced during burn-in of a device which includes a number of cells 50). As shown, during some initial read operations, the distribution of threshold voltages $V_t$ for all of the cells 50 of a device (e.g., an EEPROM, PLD or the like) may be uniformly distributed about a nominal value. Further, under the new counter-bias conditions, even after a number of continuous read operations (e.g., during a burn-in), the distribution is only slightly skewed, corresponding to a dramatically reduced $V_t$ shift ($\Delta V_t$) over that seen in FIG. 1B. FIG. 5C illustrates the corresponding reduced shift in read current ($\Delta I_{read}$).

It should also be noted that the present counter-bias scheme not only minimizes charge gain, it also has no adverse impact on charge loss as long as $$Vpd \approx (1-K_{pd}) < V_{cg} * K_g$$

(e.g., 2 V<2.3 V for the above example in Table 2). With the above condition it can be shown that the tunnel oxide electric field strength under read conditions is lower than under stand-by conditions. For example, in the above example in Table 2, as long as $V_{pd}$<2.3 V, the charge loss would be higher for stand-by erased cells with no external bias voltages than under read conditions.

Figure 6:
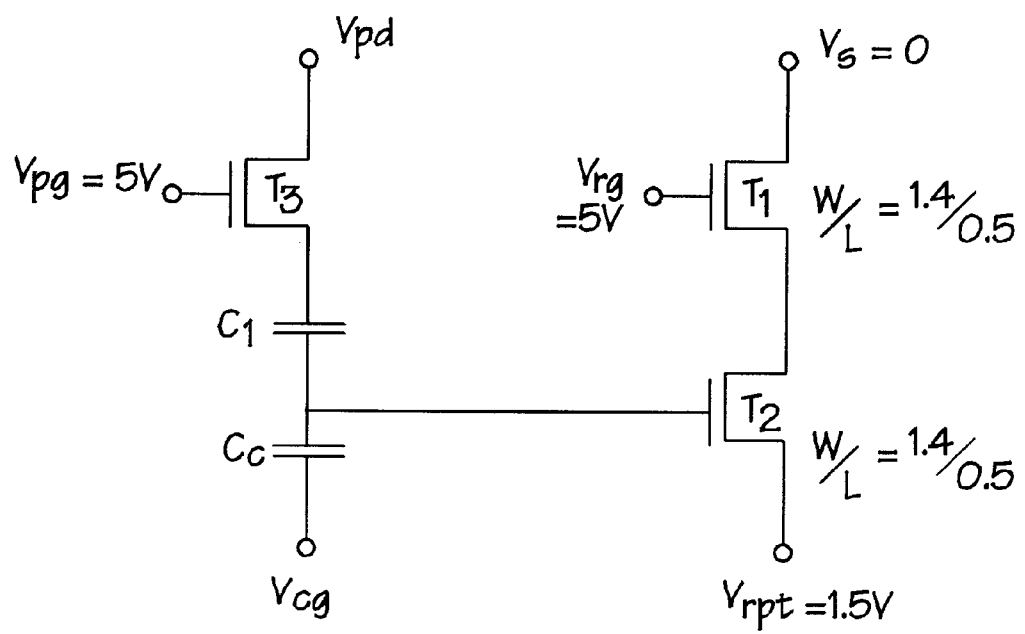
FIG. 6 is a schematic of a 6-wire cell biased in accordance with one embodiment of the present invention.

Certain experiments to confirm the improvement in charge gain using the present counter-bias scheme were successfully carried out in a test chip having 6-wire cell modules. The schematic for the cells is shown in FIG. 6. The W/L notations for T1 and T2 indicate the transistor gate width to length ratios. The $V_t$ shifts were monitored by the decrease in read current and correlating $\Delta I_{read}$ to $\Delta V_t$ from a $\Delta I_{read}$ vs. $\Delta V_{cg}$ curve. The following (Table 3) are the Vt shifts for various Vcg and Vpd, measured at a wafer temperature of 125° C., with the cells programmed to an initial threshold voltage of −0.8 V.

TABLE 3

| $V_{pd} = 0$ V | | | $V_{pd} = 1.4$ V | | | $V_{pd} = 2.2$ V | | |
| --- | --- | --- | --- | --- | --- | --- | --- | --- |
| $V_{cg}$ (V) | Time (sec) | $\Delta V_t$ (mV) | $V_{cg}$ (V) | Time (sec) | $\Delta V_t$ (mV) | $V_{cg}$ (V) | Time (sec) | $V_t$ (mV) |
| 4 | 84,100 | 258 | 5 | 1000 | 0.03 | 6 | 83,000 | 20.5 |
| 4.65 | 1000 | 29.9 | 5 | 54,100 | 1.1 | | | |
| 4.65 | 32,500 | 300 | | | | | | |
| 5 | 100 | 22.3 | | | | | | |
| 5 | 3300 | 300 | | | | | | |
| 5.38 | 100 | 127.4 | | | | | | |
| 5.38 | 410 | 300 | | | | | | |

The charge gain at Vcg=6 V with $V_{pd}$>2.2 V was seen to be less than the charge gain at $V_{cg}$=4 V with $V_{pd}$=0 V for the same read disturb time of 83,000 sec at 125° C. This tends to indicate that for the same specified charge gain, $V_{cg}$ can be increased by at least 1 V for each 1 V of counter-bias voltage on $V_{pd}$. Thus, charge gain with counter-bias can be reduced to a negligible level corresponding to a low $V_{cg}$ without a corresponding decrease in read current ($I_{read}$).

It should be noted that for each 1 V decrease in $V_{cg}$, the read disturb time for a given $\Delta V_t$ increases by approximately 100 times. Therefore, a 2 V counter-bias $V_{pd}$ would increase the read disturb time by approximately 10,000 times.

Thus a scheme for reducing and/or eliminating charge gain in an $E^2$ cell using a counter-bias voltage during read operations has been described. In summary, the maximum electric field across the tunnel oxide in an $E^2$ cell is experienced during a read operation. In one embodiment, this field can be reduced from >4 MV/cm to <2.5 MV/cm according to the methods of the present invention. Under fields of >4 MV/cm (i.e., in the absence of counter-bias voltages), the floating gate of the cell attracts electrons, resulting in large, positive shifts in the threshold voltage of the cell. For fields of <2.5 MV/cm (i.e., using counter-bias voltages in accordance with the methods of the present invention), the threshold voltage shifts are reduced to much less than 1 V, eliminating the charge gain problem.

In the foregoing specification, the invention has been described with reference to specific exemplary embodiments thereof. It will, however, be appreciated by those skilled in the art that various modifications and changes may be made thereto without departing from the broader spirit and scope of the invention as set forth in the appended claims. The specification and drawings are accordingly, to be regarded in an illustrative rather than a restrictive sense.

What is claimed is:

1. A method comprising applying a counter-bias voltage to a select transistor of an electrically erasable ($E^2$) cell during a read operation, said counter-bias voltage being approximately equal to a voltage of a floating gate of a second transistor of said ($E^2$) cell.

2. A method of reducing cell threshold voltage and read current shifts in an electrically erasable ($E^2$) cell comprising controlling a tunnel oxide field of a program select transistor in said $E^2$ cell to reduce charge gain on a floating gate of a second transistor said $E^2$ cell during read operations by applying a counter-bias voltage approximately equal to a voltage on said floating gate of said second transistor to said program select transistor of said $E^2$ cell during said read operations such that the counter bias voltage is passed on to a source of said program select transistor.

3. The method of claim 2 wherein said counter-bias voltage is applied to a drain of said program select transistor with a gate of said program select transistor biased at least one threshold voltage above said counter-bias voltage.

4. An electrically erasable ($E^2$) cell having separate program and read transistors and configured to receive a counter-bias voltage approximately equal to a voltage on a floating gate of said read transistor at said program transistor during read operations.

5. A programmable device comprising the $E^2$ cell of claim 1.

6. The programmable device of claim 5 wherein said programmable device is an electrically erasable and programmable read only memory.

7. The programmable device of claim 5 wherein said programmable device is a programmable logic device.

8. An electrically erasable ($E^2$) cell comprising a separate program and read transistors and configured to have a tunnel oxide electric field under the control of a counter-bias voltage applied to said program transistor during read operations, said counter-bias voltage being approximately equal to a voltage on a floating gate of said read transistor.

* * * * *